(12) United States Patent
Moyer

(10) Patent No.: US 6,208,677 B1
(45) Date of Patent: Mar. 27, 2001

(54) DIODE ARRAY PACKAGE WITH HOMOGENEOUS OUTPUT

(75) Inventor: Richard H. Moyer, Rolling Hills Estates, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/386,792

(22) Filed: Aug. 31, 1999

(51) Int. Cl.⁷ .................................................. H01S 3/06
(52) U.S. Cl. ............................. 372/66; 372/43; 372/75; 372/45; 372/50
(58) Field of Search ........................... 372/75, 43, 36, 372/66, 50, 45

(56) References Cited

U.S. PATENT DOCUMENTS

| | | | |
|---|---|---|---|
| 4,454,602 | 6/1984 | Smith | 372/36 |
| 4,688,940 | 8/1987 | Sommargren | 385/349 |
| 4,716,568 | 12/1987 | Scifres et al. | 372/36 |
| 4,852,109 | 7/1989 | Kuchar | 372/66 |
| 5,099,488 * | 3/1992 | Ahrabi et al. | 372/50 |
| 5,311,536 * | 5/1994 | Paoli et al. | 372/45 |
| 5,555,254 | 9/1996 | Injeyan et al. | 372/65 |

* cited by examiner

Primary Examiner—Leon Scott, Jr.
(74) Attorney, Agent, or Firm—Michael S. Yatsko

(57) ABSTRACT

A diode array (32) which includes a diode bar (22) having a plurality of laser diodes (42) within an active region (40) so as to emit light parallel to an optical axis (26), generally parallel to the laser diodes (42). The diode bars (22) are sandwiched between a pair of spacer layers (34, 36). Each spacer layer (34, 36) includes two or more spacers (48, 50). The spacers (48, 50) in each layer (34, 36) are configured such that gaps (52, 54) between contiguous spacers (48, 50) are at a non-parallel angle ($\Theta$) relative to the optical axis (26) of the diode bar (22). By orienting the gaps (52, 54) between the spacers (48, 50) at non-parallel angle relative to the optical axis (26) of the laser diodes (40), the gaps (52, 54) span several laser diodes (40), thus averaging any inhomogeneous effects caused by the gaps (52, 54) resulting in a relatively more uniform output from the various laser diodes (40) forming the diode bar (22).

8 Claims, 2 Drawing Sheets

DIODE ARRAY PACKAGE WITH HOMOGENEOUS OUTPUT

BACKGROUND OF THE INVENTION

1. Field of the Invention

The present invention relates to a diode array for use with solid state lasers and more particularly to a diode array which includes one or more diode bars, each diode bar including a one-dimensional array of laser diodes, disposed along one edge of a carrier; the laser diodes being configured to emit light parallel to an optical axis. The diode bars are sandwiched by contiguous spacer layers. Multiple spacers are provided per layer. The spacers in each layer are configured such that the gaps between the spacers are formed at non-parallel angles relative to the optical axis in order to average out any adverse affects of the gaps to provide increased uniformity of the optical outputs of the diodes forming the diode bars.

2. Description of the Prior Art

Diode arrays are known to be used with solid state lasers. In particular, such solid state lasers are known to include an optical amplifier, formed from a slab of lasing material, such as yttrium-aluminum-garnet (YAG) crystal. The diode arrays are used to excite the atoms within the lasing material to a relatively high metastable state to cause lasing action. Examples of such solid state lasers which utilize diode arrays for pumping are disclosed in U.S. Pat. Nos. 4,852,109 and 5,555,254, hereby incorporated by reference.

In order to improve the performance of the laser, light energy from the diode arrays must be relatively uniform along a direction orthogonal to the laser's optic axis to reduce thermal and stress aberrations of the resulting laser beam. Such aberrations of the resulting laser beam are known to be caused from several sources. More particularly, as discussed in detail in commonly owned copending patent application Ser. No. 08/766,434, filed on Dec. 12, 1996, in many known applications, the diode arrays are mounted one on top of another. With such a configuration, there is a non-uniform deposition of energy in the vertical direction of the lasing material resulting in unpumped zones in the lasing material which causes aberrations in the resulting laser beam. In particular, pumping of the atoms within the lasing material produces considerable heat in the areas where the atoms of the lasing material are pumped. Since the materials used for many known lasing materials are relatively poor thermal conductors, the unpumped zones cause thermal gradients in the lasing material across the laser beam, resulting in stress and thermal aberrations of the resulting laser beam. The above-mentioned copending application solves this problem by providing a plurality of diode arrays, configured to provide generally uniform energy distribution in the lasing material across the laser beam.

Another cause of aberrations in the resulting laser beam from a solid state laser is from the non-uniform light output from the laser diodes forming the diode array. More particularly, such diode arrays are known to include a plurality of laser diodes aligned along one edge of a substrate or a carrier and configured such that the light output from each of the laser diodes is parallel to an optical axis, generally perpendicular to the edge along which the laser diodes are disposed. The diode bars are generally sandwiched between layers of spacers, as generally discussed in U.S. Pat. Nos. 4,454,602 and 4,716,568, hereby incorporated by reference. More particularly, a portion of a conventional diode array is illustrated in FIG. 1 and generally identified with the reference numeral 20. As shown, the diode array 20 includes a diode bar 22 which includes a plurality of laser diodes 24, configured such that their light output is generally parallel to an optical axis indicated by the arrow 26. The diode arrays 20, are known to be formed in a stacked relationship with a plurality of diode bars 22 and attached to a heat sink for dissipating heat created by the laser diodes. In order to separate the diode bars 22, spacers, such as the spacers 28 are used. Conventional diode arrays are known to include multiple segmented spacers 28 per layer, for example, as illustrated in FIG. 1, which have gaps 30 and 32; the gaps being generally parallel to the optical axis 26. These gaps 30 and 32 can cause electrical, thermal or mechanical non-uniformities of the mounting of the diode bars 22 relative to the spacers. These non-uniformities can result in variations in the output from the various laser diode emitters forming the diode bar 22. Variations of the output of the various laser diodes can degrade the overall performance of the overall diode array and thus the resulting laser beam from the solid state laser. Thus, there is a need to provide a diode array in which the output from the individual laser diodes forming a diode bar is relatively uniform.

SUMMARY OF THE INVENTION

Briefly, the present invention relates to a diode array which includes a diode bar having a plurality of laser diodes aligned along one edge so as to emit light parallel to an optical axis, generally perpendicular to the edge in which the laser diodes are aligned. The diode bars are sandwiched between spacer layers. Two or more spacers are utilized in each layer. In accordance with an important aspect of the invention, the spacers in each layer are configured such that gaps between contiguous spacers in a spacer layer are at a non-parallel angle relative to the optical axis of the diode bar. By orienting the gaps between the spacers at non-parallel angles relative to the optical axis of the laser diodes, the gaps span several laser diodes, thus averaging any inhomogeneous effects caused by the gaps resulting in a relatively more uniform output from the various laser diodes forming the diode bar.

BRIEF DESCRIPTION OF THE DRAWINGS

These and other advantages of the present invention will be readily apparent with reference to the following specification and attached drawing wherein.

DETAILED DESCRIPTION

Figure 2:
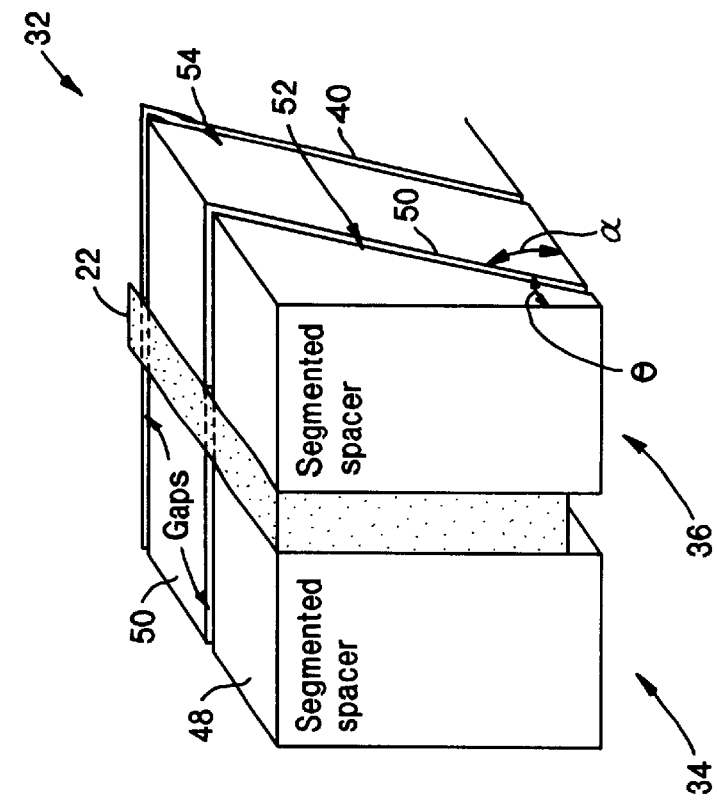
FIG. 2 is a perspective view of a portion of the diode array in accordance with the present invention.
Figure 1:
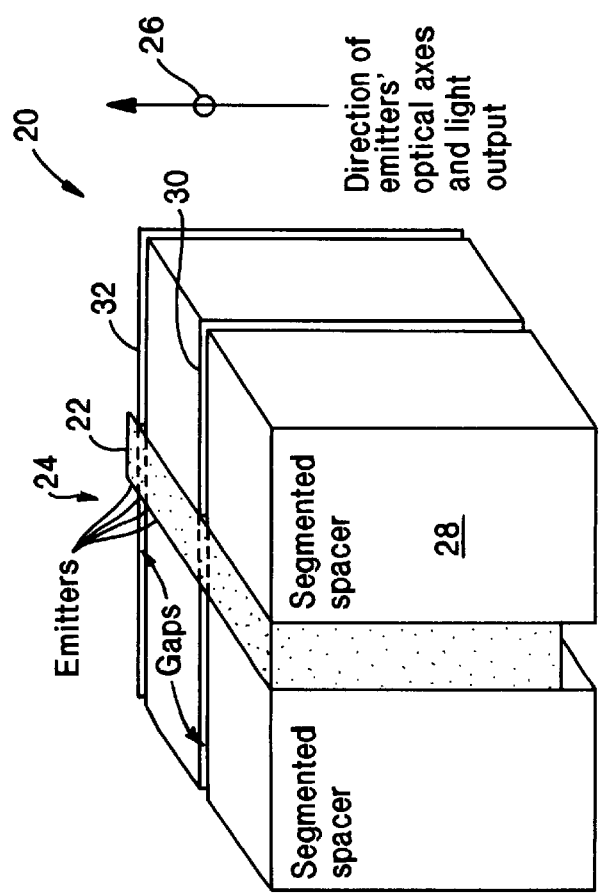
FIG. 1 is a perspective view of a portion of a conventional diode array illustrating a diode bar sandwiched between two layers of spacers.

The diode array in accordance with the present invention is generally illustrated in FIG. 2 and identified with the reference numeral 32. In accordance with an important aspect of the invention, the diode array 32 is adapted to provide relatively uniform light output from the laser diodes disposed on the diode bars which form the diode array. As discussed above, such diode arrays must provide relatively homogeneous pumping across the laser beam of a solid state laser. As will be discussed in more detail below, the configuration of the diode array in accordance with the present invention compensates for the thermal, electrical and mechanical effects of the gaps between segmented spacers in a spacer layer to provide a relatively uniform output from each of the laser diodes in the diode bar. By providing a uniform output of the laser diodes in the diode bar, the resulting laser beam from the solid state laser will be improved.

Turning to FIG. 2, a portion of a diode array 32 in accordance with the present invention is illustrated. The diode array 32 includes one or more diode bars 22, arranged so that the optical output from the laser diodes is generally parallel to an optical axis 26. In an application where multiple diode bars 22 are utilized, such diode bars 22 are sandwiched between spacer layers 34 and 36. For simplicity, only a single diode bar 22 is used to describe and illustrate the invention; however, the principles of the present invention are applicable to any number of diode bars.

Figure 3:
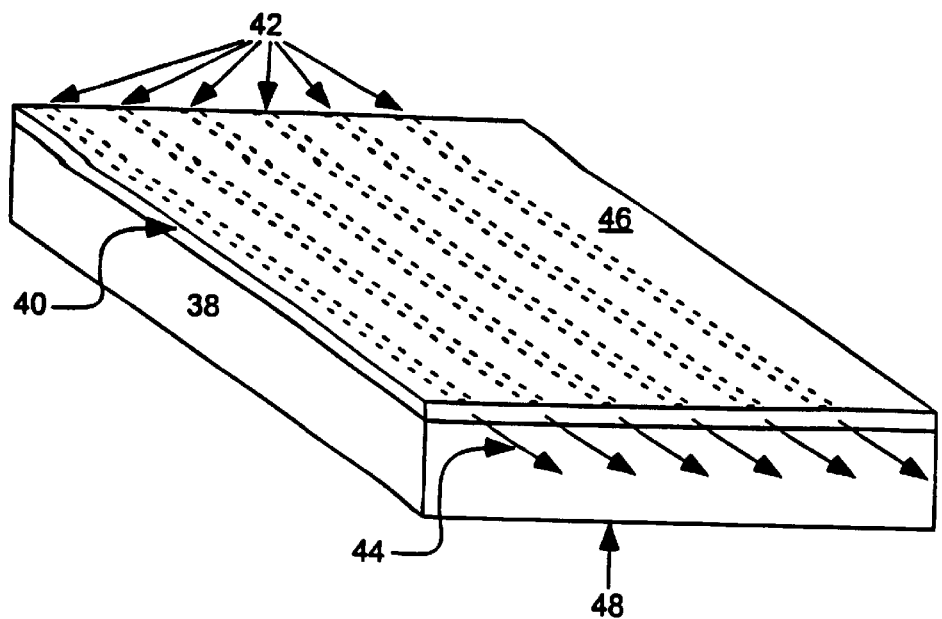
FIG. 3 is a perspective view of a diode bar for use with the present invention.

The construction of the diode array is as generally described in detail in U.S. Pat. No. 4,716,568, hereby incorporated by reference. In particular, one or more generally planar diode bars 22 are sandwiched between a pair of spacer layers 34 and 36. The construction of the diode bars 22 is generally illustrated in FIG. 3. As shown therein, each diode bar 22 is formed from a generally planar substrate 38, formed from a semiconductor material, such as GaAs or InP, with an expitaxial active region 40 on one surface. Individual lasers 42, such as laser diodes, are formed within the active region 40 and configured to emit light along a direction 44, generally parallel to the plane of the substrate. Examples of such laser diodes are discussed in detail in U.S Pat. Nos. 5,909,458; 5,629,954; 4,633,487 and 4,716,568. The top and bottom surfaces 46 and 48 of the substrate 38 may be coated with an electrically conductive material, such as gold or solder.

As shown in FIG. 2, the diode bar 22 is sandwiched by the spacer layers 34 and 36. The spacer layers 34 and 36 each include a plurality of segmented spacers 48, 50, depending on the size of the diode bar 22. The segmented spacers 48, 50 may be formed from an electrically conductive material, such as copper. In accordance with an important aspect of the present invention, the segmented spacers 48, 50 forming each layer 34, 36 are configured such that the gaps 52 and 54, between contiguous segmented spacers 48, 50 in a single layer 34 and 36, are not parallel to the optical axis 26. More particularly, as shown, the segmented spacers 48 and 50 have generally non-rectangular cross sections in a plane parallel to the plane of the diode bar 22. For example, as shown in FIG. 2, end spacers, such as the spacer 48, may be formed with a generally triangular cross section in which the hypotenuse 54 of the triangle is at an acute angle $\Theta$ relative to the optical axis 26, for example in the range of 30 degrees to 60 degrees. Interior segmented spacers, such as the segmented spacer 50, may be formed in a generally parallelogram configuration defining a pair of opposing faces 58 and 60. The angle $\alpha$ of the faces 58 and 60 relative to the optical axis 26 is selected such that the angle $\Theta+\alpha$ is generally equal to 90°.

When the segmented spacers 48 and 50 are disposed within a layer 34, 36 adjacent one another, a gap 52 therebetween is defined. Due to the configuration of the segmented spacers 48 and 50, the gap 52 between these spacers 48 and 50 will be at an angle $\Theta$ relative to the optical axis 26. Any number of segmented spacers, configured as the segmented spacer 50 may be disposed contiguous to one another to form one or more gaps 54 at an angle $\Theta$, relative to the optical axis 26. The last segmented spacer in the layer 34 and 36 (not shown) at an end opposite of the spacer 48 may be formed with a triangular cross section in a plane, generally parallel to the optical axis 26. By so configuring the spacers, all of the gaps 52, 54 between the segmented spacers 48, 50 in each layer 34 and 36 will span several laser diodes.

Figure 4:
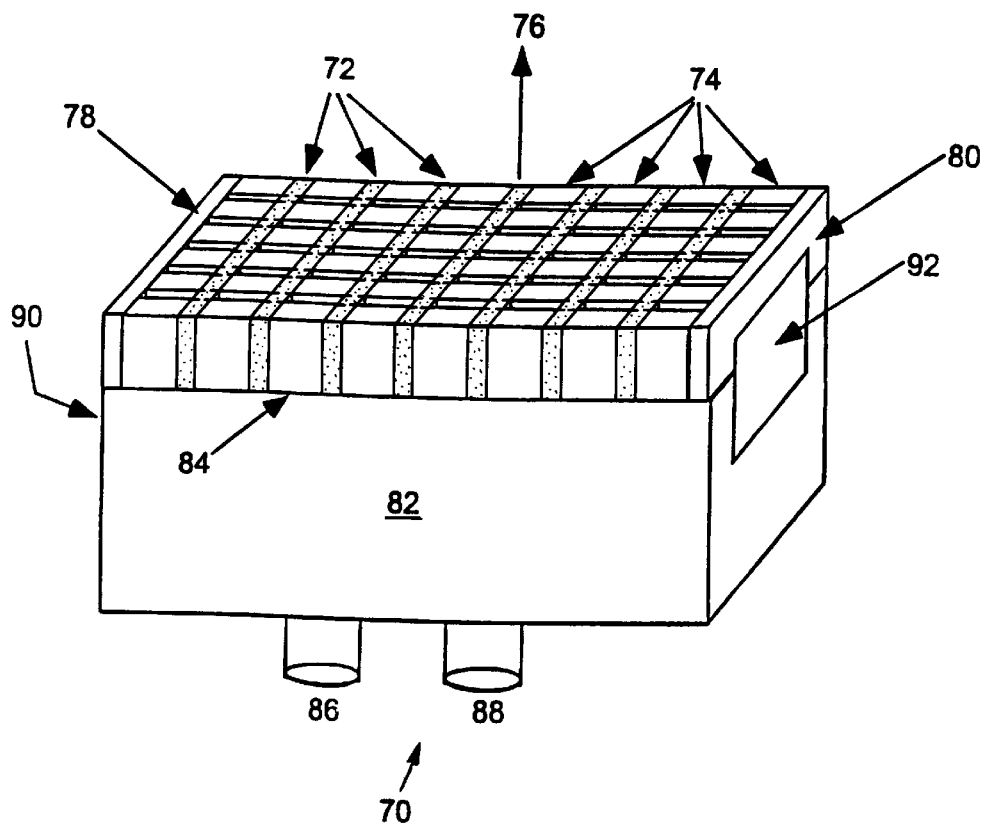
FIG. 4 is a perspective view of a diode array in accordance with the present invention.

A diode array incorporating the present invention is illustrated in FIG. 4 and generally identified with the reference numeral 70. The diode array 70 includes a plurality of diode bars 72, separated by a plurality of segmented spacers 74. The segmented spacers 74, in accordance with the present invention, are as illustrated in FIG. 2. The diode bar 72 is configured so that light is emitted in a direction generally parallel to the arrow 76. A pair of end caps 78 and 80 may be provided and disposed generally parallel to the diode bars 72.

In order to reduce the heat of the diode array 70 and thus increase its overall power, the combination of diode bars 72 and spacers 74 may be carried by a diode array cooler 82. Both diode bars 72 and spacers 74 are attached to the cooler 82 by a heat-conductive bonding material 84 such as solder. The heat conducted into the cooler is extracted by means such as flowing fluid such as water through connections 86 and 88. Electrical power is provided at each end of the stack with contacts 90 and 92.

As mentioned above, the gaps between the segmented spacers in conventional diode bars can cause various non-uniformities in the light output of the diode array 70, which can effect the individual output of the various laser diodes mounted on the diode bar. By forming the gaps 52, 54 at an angle $\Theta$, relative to the optical axis 26, the gaps 52, 54 will span several laser diodes thus averaging the inhomogeneous effects of the gaps 52, 54. As a result, the light output from the individual laser diodes forming the diode array 70 will be relatively uniform. As mentioned above, such diode arrays 70 are used for pumping the lasing material in solid state lasers by providing a relatively uniform output from the diode array, resulting laser beam from the solid state laser will be improved.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A diode array comprising:
   one or more generally planar diode bars, each diode bar including a plurality of laser diodes aligned along one edge of a generally planar substrate, said laser diodes adapted to emit light along an optical axis, generally perpendicular to said one edge; and a plurality of spacer layers for sandwiching each diode bar, each spacer layer formed from a plurality of spacers disposed contiguous to one another forming a gap therebetween, wherein the spacers are configured such that the gaps are at non-parallel angle relative to the optical axis.

2. The diode array as recited in claim 1, wherein said spacers within a single layer are formed with different cross sections.

3. The diode array as recited in claim 2, wherein said spacers within a single layer include a pair of end spacers and one or more interior spacers.

4. The diode array as recited in claim 3, wherein said end spacers are formed with a non-rectangular cross section in a plane generally parallel to the plane of said diode bar.

5. The diode array as recited in claim 4, wherein said non-rectangular cross section of said end spacers is a generally triangular cross section.

6. The diode array as recited in claim 3, wherein said interior spacers are formed with a non-rectangular cross section in a plane generally parallel to said divide bar.

7. The diode bar as recited in claim 6, wherein said non-rectangular cross section of said interior spacers forms generally a parallelogram.

8. In combination, a diode array which includes one or more diode bars for carrying a plurality of laser diodes configured to emit light along an optical axis sandwiched between contiguous spacer layers, two or more spacers forming each spacer layer, wherein the improvement comprises configuring the spacers such that the gap defined between contiguous spacers in a single layer of spacers is not parallel to the optical axis.

\* \* \* \* \*